(12) United States Patent
Sung et al.

(10) Patent No.: US 8,044,404 B2
(45) Date of Patent: Oct. 25, 2011

(54) DISPLAY APPARATUS AND MANUFACTURING METHOD THEREOF

(75) Inventors: Un-cheol Sung, Anyang-si (KR); Sang-pil Lee, Seoul (KR); Hoon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 803 days.

(21) Appl. No.: 11/676,753

(22) Filed: Feb. 20, 2007

(65) Prior Publication Data

US 2007/0194322 A1 Aug. 23, 2007

(30) Foreign Application Priority Data

Feb. 20, 2006 (KR) .................. 10-2006-0016202

(51) Int. Cl.
*H01L 27/12* (2006.01)
(52) U.S. Cl. .................... 257/72; 257/E27.111
(58) Field of Classification Search .................. 257/40, 257/66, 72, 347, 49, E27.111, E27.112, E27.113
See application file for complete search history.

(56) References Cited

U.S. PATENT DOCUMENTS

| | | | |
|---|---|---|---|
| 2001/0013756 A1* | 8/2001 | Mori et al. | 313/512 |
| 2004/0135501 A1* | 7/2004 | Nishikawa | 313/506 |
| 2005/0287392 A1* | 12/2005 | Toyoda | 428/690 |

FOREIGN PATENT DOCUMENTS

| | | |
|---|---|---|
| JP | 10282331 | 10/1998 |
| JP | 2002151252 | 5/2002 |
| KR | 1020020037608 | 5/2002 |
| KR | 1020020082153 | 10/2002 |
| KR | 1020040042855 | 5/2004 |
| KR | 10-2005-0030296 A * | 3/2005 |

OTHER PUBLICATIONS

Korean Office Action for Patent Application No. 10-2006-0016202; Date of Mailing: Feb. 26, 2007.

* cited by examiner

*Primary Examiner* — Ha Tran T Nguyen
*Assistant Examiner* — Kevin Quinto
(74) *Attorney, Agent, or Firm* — Cantor Colburn LLP

(57) ABSTRACT

A display apparatus includes; a substrate, a transistor formed on the substrate, a pixel electrode connected to the transistor, a wall surrounding the pixel electrode, the wall including a main wall and a sub wall, the main wall having a first height and the sub wall having a second height less than the first height of the main wall, an organic layer formed on the pixel electrode, a common electrode formed on the organic layer, and an encapsulation substrate coupled to the substrate.

12 Claims, 22 Drawing Sheets

DISPLAY APPARATUS AND MANUFACTURING METHOD THEREOF

This application claims priority to Korean Patent Application No. 2006-0016202, filed on Feb. 20, 2006, and all the benefits accruing therefrom under 35 U.S.C. §119, the contents of which in its entirety are herein incorporated by reference.

BACKGROUND OF INVENTION

1. Field of Invention

The present invention relates to a display apparatus and a manufacturing method thereof, and more particularly, to a display apparatus and a manufacturing method thereof using an encapsulation substrate.

2. Description of the Related Art

Recently, as one of flat panel displays, an organic light emitting diode ("OLED") has become popular since OLED's have the advantages of requiring a low driving voltage, being relatively light weight and slim, having a wide viewing angle, having a high pixel response speed and other positive attributes.

The OLED display includes a light emitting layer which is made of an organic material, and which is formed on an insulation substrate. The light emitting layer is supplied with an electron and a hole to generate light. The light emitting layer is apt to be damaged by oxygen and moisture because the light emitting layer is formed of an organic material.

To protect the light emitting layer from oxygen and moisture, the OLED uses an encapsulation substrate formed of a glass or a metal. However, the encapsulation substrate is apt to be deformed since it is relatively thin to reduce the weight thereof. Therefore the deformation thereof becomes larger as the OLED display part increases in size.

As such, the deformed encapsulation substrate pushes against a display element, and accordingly, the display element deteriorates.

BRIEF SUMMARY OF THE INVENTION

Accordingly, it is an aspect of the present invention to provide a display apparatus and a manufacturing method thereof which prevents deterioration due to the deformation of an encapsulation substrate.

An exemplary embodiment of the display apparatus includes; a substrate, a transistor formed on the substrate, a pixel electrode connected to the transistor, a wall surrounding the pixel electrode, the wall including a main wall and a sub wall, the main wall having a first height and the sub wall having a second height less than the first height of the main wall, an organic layer formed on the pixel electrode, a common electrode formed on the organic layer and an encapsulation substrate coupled to the substrate.

According to an exemplary embodiment of the present invention, at least one of the first height and the second height of the wall is greater than a height of the pixel electrode.

According to an exemplary embodiment of the present invention, a surface of the substrate is encapsulated when the encapsulation substrate is coupled to the substrate.

According to an exemplary embodiment of the present invention, the pixel electrode is formed at the encapsulated surface of the substrate.

According to an exemplary embodiment of the present invention, the first height is about 50 micrometers ($\mu$m) to about 1000 micrometers ($\mu$m).

According to an exemplary embodiment of the present invention, the second height is about 0.5 micrometers ($\mu$m) to about 30 micrometers ($\mu$m).

According to an exemplary embodiment of the present invention, the second height is about 10 percent to about 50 percent of the first height.

According to an exemplary embodiment of the present invention, the encapsulation substrate includes a first part and a second part, wherein the first part is substantially parallel to the substrate, and the second part extends from the first part toward the substrate.

According to an exemplary embodiment of the present invention, the display apparatus further includes a sealant interposed between the substrate and the second part, and which attaches the substrate to the encapsulation substrate.

According to an exemplary embodiment of the present invention, the encapsulation substrate is formed by etching a glass plate.

According to an exemplary embodiment of the present invention, the wall is formed of a photoresist material.

An exemplary embodiment of a method of manufacturing a display apparatus includes; forming a transistor on a substrate, forming a pixel electrode connected to the transistor, forming a wall surrounding the pixel electrode and including a main wall and a sub wall, the main wall having a first height and the sub wall having a second height less than the first height, forming an organic layer on the pixel electrode, forming a common electrode on the organic layer and coupling an encapsulation substrate to the substrate.

According to an exemplary embodiment of the present invention, the forming the wall includes forming the wall with at least one of the first height and the second height greater than a height of the pixel electrode.

According to an exemplary embodiment of the present invention, the coupling includes encapsulating a surface of the substrate.

According to an exemplary embodiment of the present invention, the pixel electrode is formed at the encapsulated surface of the substrate.

According to an exemplary embodiment of the present invention, the forming the wall includes forming the first height to about 50 micrometers ($\mu$m) to about 1000 micrometers ($\mu$m).

According to an exemplary embodiment of the present invention, the forming the wall includes forming the second height to about 0.5 micrometers ($\mu$m) to about 30 micrometers ($\mu$m).

According to an exemplary embodiment of the present invention, the forming the wall includes forming the second height to about 10 percent to about 50 percent of the first height.

According to an exemplary embodiment of the present invention, the forming the wall includes forming a photoresist layer, and exposing the photoresist layer.

According to an exemplary embodiment of the present invention, the forming the wall includes one of a slit coating, a spin coating and a screen printing process.

According to an exemplary embodiment of the present invention, the exposing the photoresist layer includes using a slit mask or a semitransmissive mask.

According to an exemplary embodiment of the present invention, the forming the wall includes forming a wall material layer, and imprinting the wall material layer.

According to an exemplary embodiment of the present invention, the encapsulation substrate comprises includes a first part and a second part, wherein the first part is substantially parallel to the substrate, and the second part extends from the first part toward the substrate, and wherein the coupling the substrate and the encapsulation substrate includes applying a sealant to one of the substrate and the second part.

BRIEF DESCRIPTION OF THE DRAWINGS

The above and other aspects, features and advantages of the present invention will become more apparent by describing in more detail exemplary embodiments thereof with reference to the accompanying drawings, in which.

DETAILED DESCRIPTION OF THE INVENTION

Figure 1:
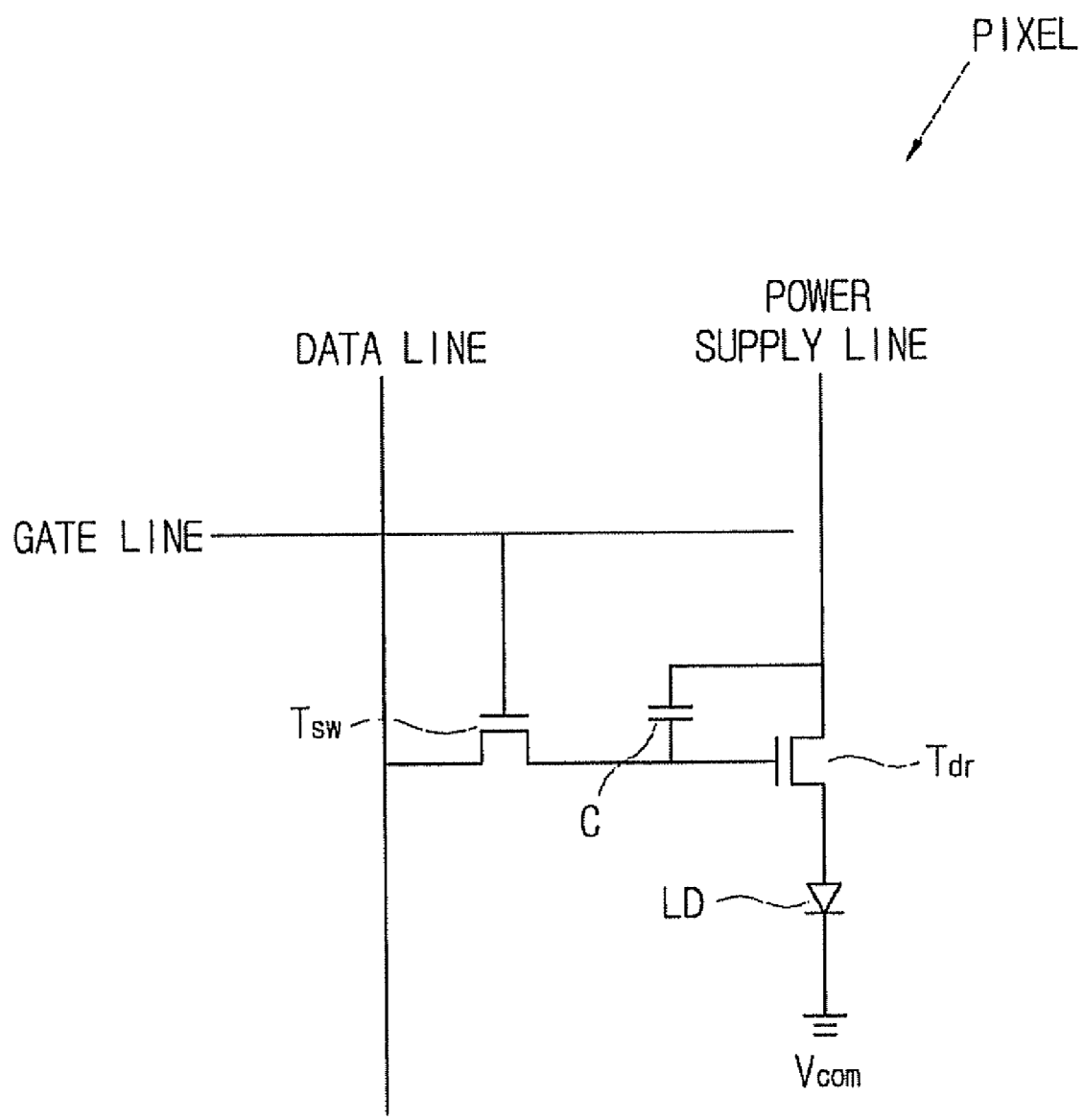
FIG. 1 is a circuit diagram of a first exemplary embodiment of a pixel provided to a display apparatus according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is a circuit diagram of a first exemplary embodiment of a display apparatus according to the present invention which includes a pixel provided with a plurality of signal lines. The signal lines include a gate line transmitting an emitting signal, a data line transmitting a data signal and a power supply line transmitting a driving voltage. The data lines are arranged adjacently and substantially in parallel to the power supply line, and the gate lines extend substantially perpendicular to and intersects the data line and the power supply line.

Referring to FIG. 1, each pixel includes an organic light emitting element LD, a switching thin film transistor Tsw, a driving thin film transistor Tdr and a capacitor C.

The driving thin film transistor Tdr includes a control terminal connected to the switching thin film transistor Tsw and one side of the capacitor C, an input terminal connected to the power supply line and an output terminal connected to the organic light emitting element LD.

The organic light emitting element LD includes an anode connected to the output terminal of the driving thin film transistor Tdr, and a cathode connected to a common voltage Vcom. The organic light emitting element LD emits light with varying intensity according to an output current of the driving thin film transistor Tdr. The current outputted by the driving thin film transistor Tdr varies according to the voltage supplied between the control terminal and the output terminal thereof. A plurality of organic light emitting elements LD may work together to display an image.

Still referring to FIG. 1, the switching thin film transistor Tsw includes a control terminal connected to the gate line, an input terminal connected to the data line, and an output terminal connected to the control terminal of the driving thin film transistor Tdr and one side of the capacitor C. The switching thin film transistor Tsw transmits the data signal supplied from the data line to the driving thin film transistor Tdr based on the emitting signal supplied from the gate line.

The capacitor C is connected between the control terminal and the input terminal of the driving thin film transistor Tdr. The capacitor C is charged with the data signal inputted to the control terminal of the driving thin film transistor Tdr.

Figure 2:
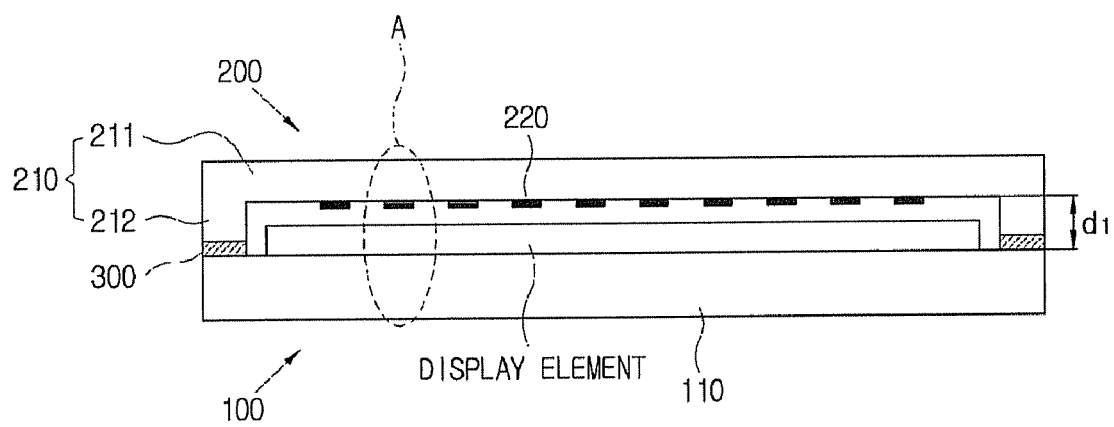
FIG. 2 is a schematic cross-sectional view illustrating the first exemplary embodiment of the display apparatus according to the present invention.
Figure 3:
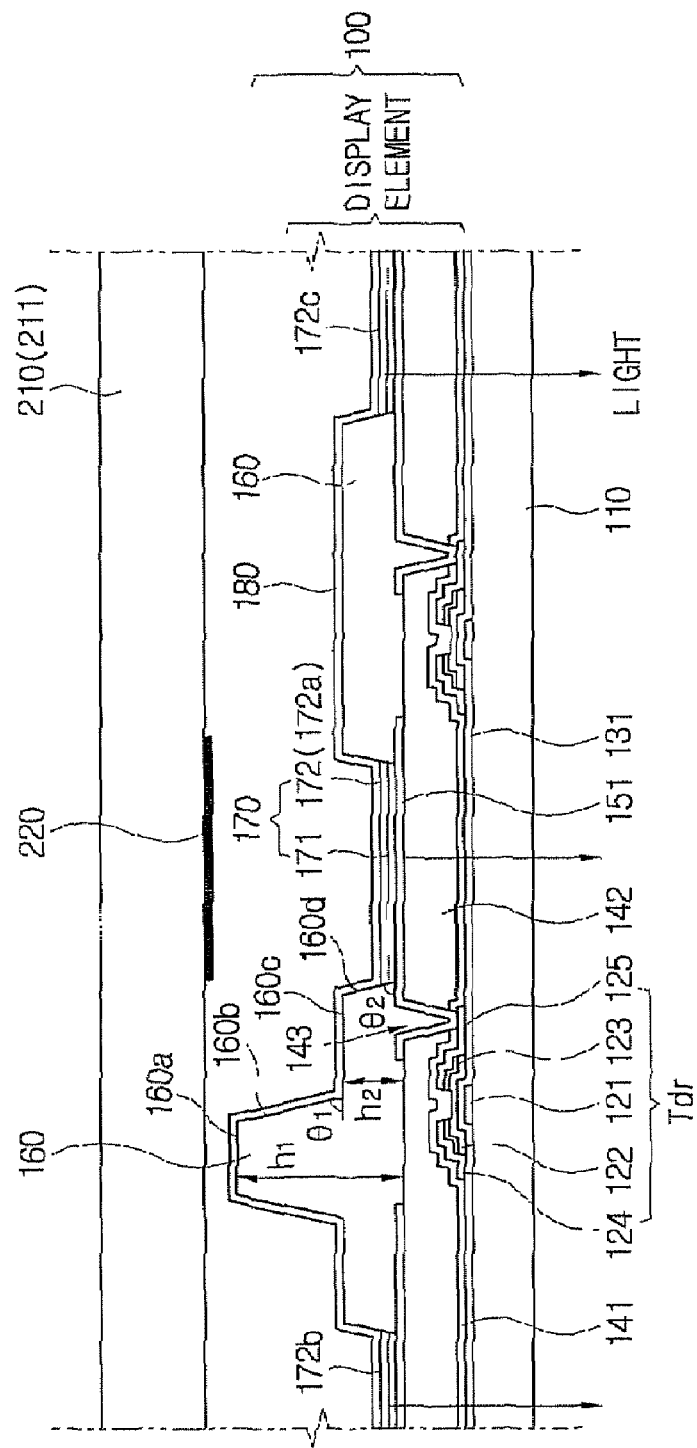
FIG. 3 is an enlarged schematic cross-sectional view of a circled portion 'A' in phantom lines of the first exemplary embodiment in FIG. 2.

As shown in FIGS. 2 and 3, the display apparatus according to the first exemplary embodiment of the present invention includes a display substrate 100, an encapsulation part 200 coupled to the display substrate 100 and a sealant 300 which attaches the respective circumferences of the display substrate 100 and the encapsulation part 200 to each other. The display substrate 100 includes an insulation substrate 110 having a substantially planar shape, and a display element formed on the insulation substrate 110.

Referring to FIG. 2, the encapsulation part 200 includes an encapsulation substrate 210, and a moisture absorbing layer 220 provided on an inner side of the encapsulation substrate 210. The encapsulation substrate 210 includes a first plane 211 which is substantially in parallel to the insulation substrate 110, and a second plane 212 extending in a direction substantially perpendicular to the first plane 211 from the first plane 211 toward the insulation substrate 110. That is, the encapsulation substrate 210 is formed to have an accommodating space. Exemplary embodiments of the encapsulation substrate 210 may be formed of a glass or a metal. The encapsulation substrate 210 formed of a glass may be manufactured by etching a planar glass.

The interval d1 between the insulation substrate 110 and the encapsulation substrate 210 may be about 100 micrometers (μm) to about 1100 micrometers (μm).

Referring to FIG. 3, the driving thin film transistor Tdr is illustrated, however the switching thin film transistor Tsw is not shown.

Still referring to FIG. 3, a gate insulation layer 131, formed of silicon nitride ("SiNx"), or other similar substances, is formed on the insulation substrate 110 and on a gate electrode 121. A semiconductor layer 122 formed of amorphous silicon and an ohmic contact layer 123 formed of a hydrogenated n+ amorphous silicon doped with an n-type impurity of high density are sequentially formed over the gate insulation layer 131. The semiconductor layer 122 and the ohmic contact layer 123 corresponds to the gate electrode 121. The ohmic contact layer 123 is divided, such that a space is formed over the gate electrode 121, as illustrated in FIG. 3.

A source electrode 124 and a drain electrode 125 are formed over the ohmic contact layer 123 and the gate insulation layer 131. The source electrode 124 and the drain electrode 125 are separated from each other to interpose the gate electrode 121 therebetween, as illustrated in FIG. 3.

A passivation layer 141 is formed over the source electrode 124, the drain electrode 125 and the semiconductor layer 122. A portion of the semiconductor layer 122 is exposed between the source electrode 124 and the drain electrode 125, as illustrated in FIG. 3. The passivation layer 141 may be formed of silicon nitride ("SiNx").

Still referring to FIG. 3, a flat layer 142 is formed of an organic material over the passivation layer 141. Exemplary embodiments of the flat layer 142 may be formed of one of benzocyclobutene ("BCB") series, olefin series, acrylic resin series, polyimide series, polytetrafluoroethylene (e.g., Teflon series), Cytop™, and perfluorocyclobutane ("PFCB").

A contact hole 143 is formed in the flat layer 142 and the passivation layer 141 to expose the drain electrode 125, as illustrated in FIG. 3.

A pixel electrode 151 is formed over the flat layer 142. The pixel electrode 151 supplies a hole to a light emitting layer 172. Exemplary embodiments of the pixel electrode 151 may be formed of a transparent conductive material such as indium tin oxide ("ITO"), indium zinc oxide ("IZO"), or other similar substances by a sputtering method. The pixel electrode 151 may be patterned to have a quadrangle shape in a plan view.

A wall 160 is formed between the respective pixel electrodes 151. The wall 160 divides the respective pixel electrodes 151 to define a pixel area. The wall 160 prevents the source electrode 124 and the drain electrode 125 from being short-circuited with a common electrode 180. Exemplary embodiments of the wall 160 may be formed of a photoresist material with thermal resistance and solvent resistance, such as an acrylic resin, a polyimide, or other similar substances.

The wall 160 includes a main wall 160a and a sub wall 160c. A first side 160b connecting the main wall 160a with the sub wall 160c includes a first inclination angle θ1 with respect to the insulation substrate 110, and a second side 160d extending substantially from the sub wall 160c to the pixel electrode 151, includes a second inclination angle θ2 with respect to the insulation substrate 110, as illustrated in FIG. 3.

The height h1 of the main wall 160*a* may be about 50 micrometers (μm) to about 1000 micrometers (μm), and the height h2 of the sub wall 160*c* may be about 0.5 micrometers (μm) to about 30 micrometers (μm). The height h1 (FIG. 3) of the main wall 160*a* is determined according to the interval d1 (FIG. 2) between the insulation substrate 110 and the encapsulation substrate 210. The height h1 (FIG. 3) of the main wall 160*a* is slightly less than the interval d1 (FIG. 2) between the insulation substrate 110 and the encapsulation substrate 210. The driving thin film transistor Tdr can be efficiently protected when the encapsulation substrate 210 is deformed, if the height h1 (FIG. 3) of the main wall 160*a* is less than 50 micrometers (μm). Also, if the height h1 (FIG. 3) of the main wall 160*a* is greater than 1000 micrometers (μm), the first inclination angle θ1 excessively increases, and accordingly, the common electrode 180 becomes difficult to form.

However, if the height h2 (FIG. 3) of the sub wall 160*c* is less than 0.5 micrometers (μm), the insulation thereof is weakened, and accordingly, the source electrode 124 and the drain electrode 125 are apt to be short-circuited with the common electrode 180. Also, if the height h2 (FIG. 3) of the sub wall 160*c* is greater than 30 micrometers (μm), the second inclination angle θ2 excessively increases, and accordingly, the common electrode 180 becomes difficult to form.

An organic layer 170, which includes a hole injection layer 171 and the light emitting layer 172, is formed over the pixel electrode 151.

Exemplary embodiments of the hole injection layer 171 may be formed of a mixture of polythiophen derivatives such as poly (3,4-ethylenedioxythiophene) ("PEDOT"), or other similar substances and polystyrene sulphonate ("PSS"), or other similar substances.

The light emitting layer 172 includes a red light emitting layer 172*a*, a green light emitting layer 172*b* and a blue light emitting layer 172*c*.

Exemplary embodiments of the light emitting layer 172 may be formed of polyfluorene derivatives, (poly) paraphenylenevinylene derivatives, polyphenylene derivatives, polyvinyl carbazole, polythiophen derivatives, or similar substances doped with a perylene series pigment, a rhodamine series pigment, rubrene, perylene, 9,10-diphenylanthracene, tetraphenylbutadiene, nile red, coumarin 6, quinacridone, or other similar substances.

A hole transmitted from the pixel electrode 151 and an electron transmitted from the common electrode 180 are coupled to form an exciton. When the exciton de-excites, e.g., when the electron falls from a higher energy state to a lower energy state, a photon is emitted.

As illustrated in FIG. 3, the common electrode 180 is positioned over the wall 160 and the light emitting layer 172. The common electrode 180 supplies an electron to the light emitting layer 172. Exemplary embodiments of the common electrode 180 may include a lithium fluoride layer and an aluminum fluoride layer. In a bottom emission type display, the common electrode 180 is formed of an opaque material such as aluminum, silver, or other similar substances, and the light of the light emitting layer 172 is emitted toward the insulation substrate 110, as illustrated in FIG. 3.

Figure 4:
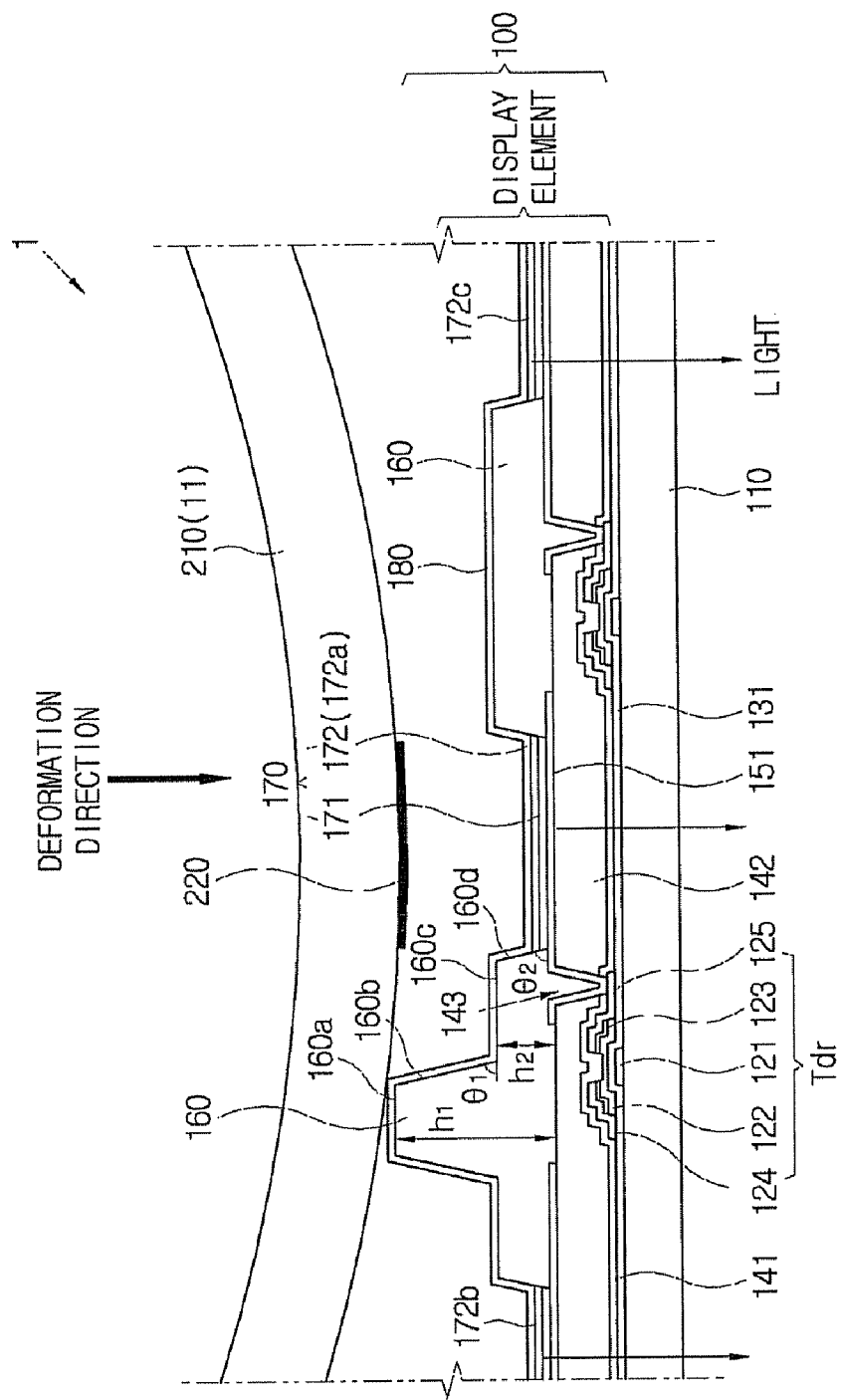
FIG. 4 is a schematic cross-sectional view illustrating deformation, in the direction shown by an arrow, of the first exemplary embodiment of the encapsulation substrate of the display apparatus according to the present invention.

As shown in FIG. 4, as the display part of the display apparatus 1 increases in size, the encapsulation substrate 210 becomes larger and is apt to be deformed toward the insulation substrate 100 along the deformation direction, due to its own weight. When the encapsulation substrate 210 is deformed, the encapsulation substrate 210 contacts the main wall 160*a* of the wall 160 first, thereby preventing the driving thin film transistor Tdr from being damaged.

Hereinafter, a first exemplary embodiment of a manufacturing method of the first exemplary embodiment of the display apparatus according to the present invention will now be described in more detail with reference to FIGS. 5 to 13.

Figure 5:
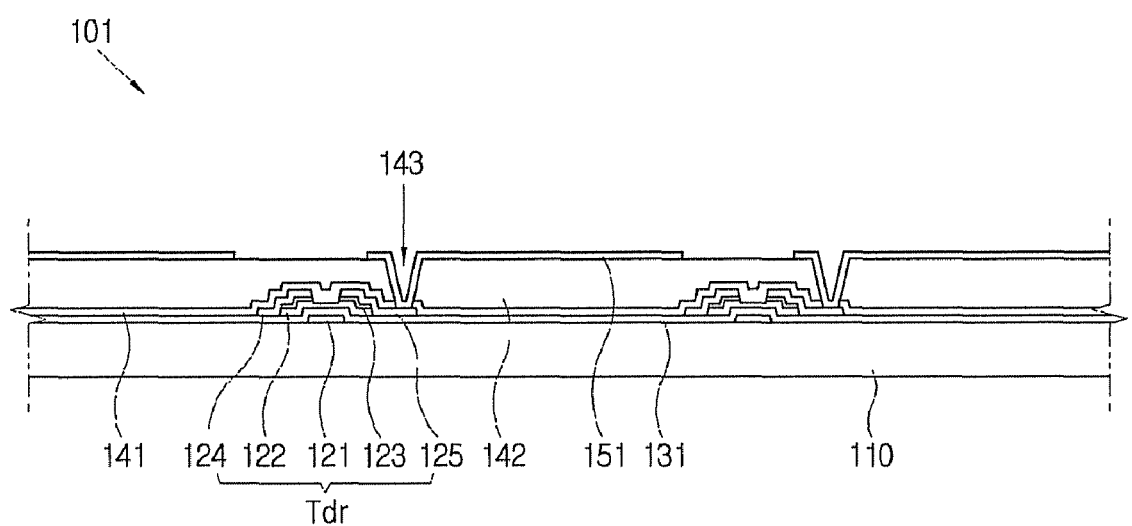
FIGS. 5 and 6A are schematic cross-sectional views illustrating a first exemplary embodiment of a method of manufacturing a first exemplary embodiment of a display apparatus according to the present invention.

Referring to FIG. 5, the pixel electrode 151 and other layers are formed above the display substrate 101.

Figure 6A:
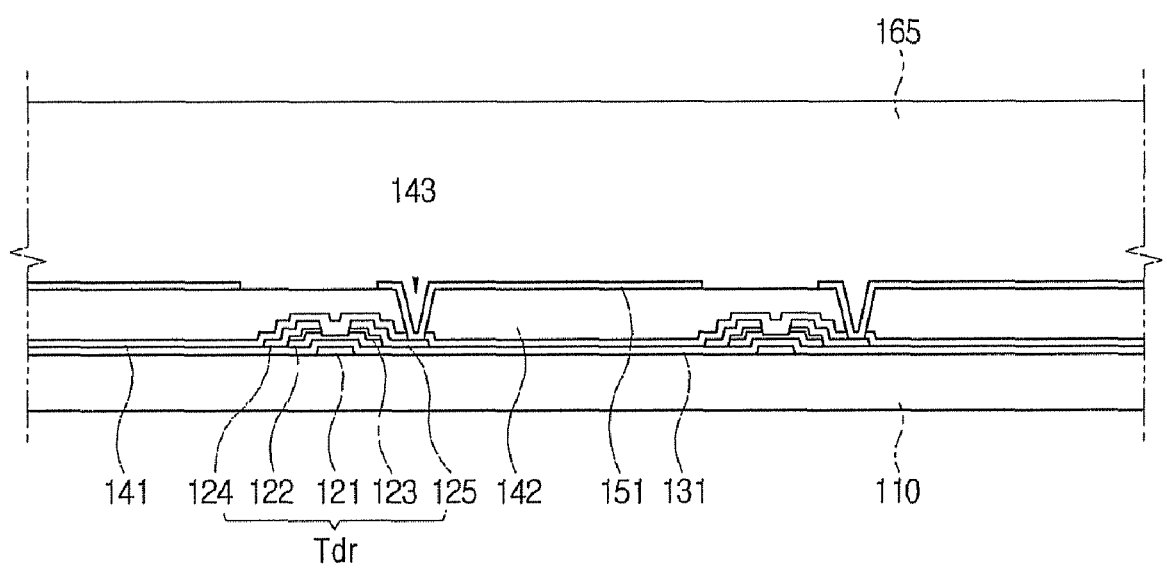
Figure 6B:
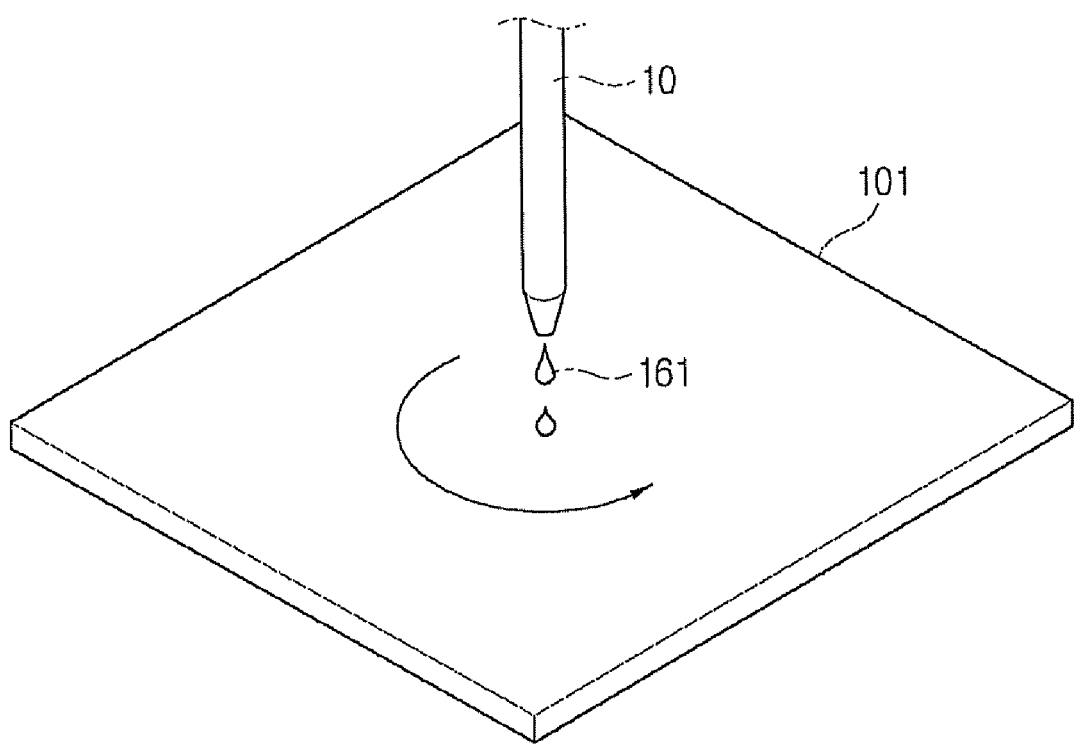
FIG. 6B is a schematic perspective view illustrating a first exemplary embodiment of a method of manufacturing the first exemplary embodiment of the display apparatus according to the present invention.

Referring to FIGS. 6A and 6B, a photoresist layer 165 is formed over the pixel electrode 151. An exemplary embodiment of the photoresist layer 165 may be formed by a spin coating method, and may be formed by other suitable methods. A photoresist 161 is jetted onto the display substrate 101 through a nozzle 10 while the display substrate 101 is rotated, in order to uniformly distribute the photoresist 161 onto the display substrate 101 when forming the photoresist layer 165.

Figure 7A:
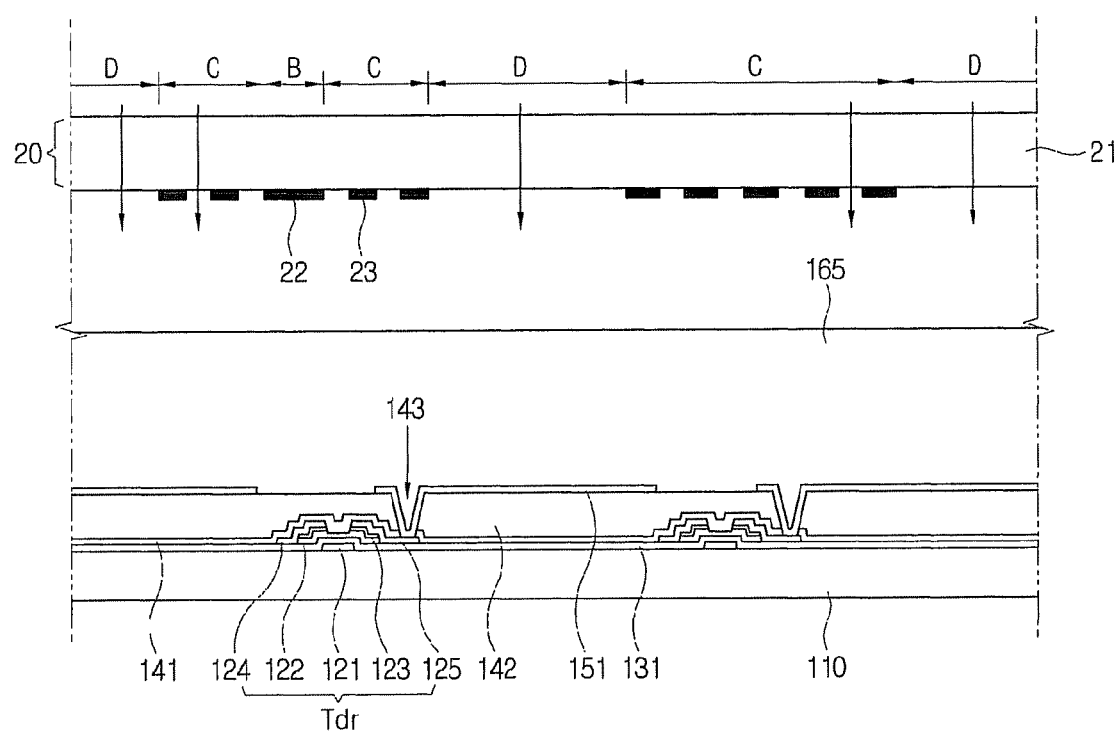
FIG. 7A is a schematic cross-sectional view illustrating a first exemplary embodiment of a method of manufacturing the first exemplary embodiment of the display apparatus according to the present invention.

Referring to FIG. 7A, the photoresist layer 165 is exposed. The photoresist layer 165 is divided into parts, a part B which is to remain, a part C which is to partially remain and a part D which is to be completely removed. Part B becomes the main wall 160*a*, and part C becomes the sub wall 160*c*.

A mask 20 used for exposing the photoresist layer 165 includes a transparent mask substrate 21, a blocking pattern 22 formed to part B and a slit pattern 23 formed to part C. An exemplary embodiment of the mask substrate 21 may be formed of a quartz material, and the blocking pattern 22 and the slit pattern 23 may be formed of a chrome layer.

Figure 7B:
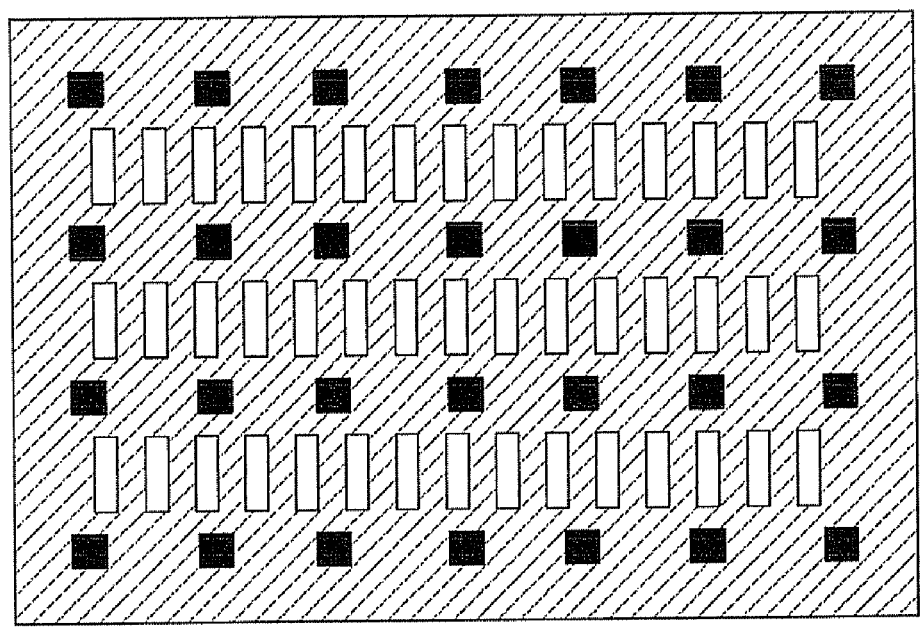
FIG. 7B is a schematic top plan view illustrating an exemplary embodiment of a mask used in a first exemplary embodiment of a method of manufacturing the first exemplary embodiment of the display apparatus according to the present invention.

FIG. 7B is a plan view illustrating an exemplary embodiment of the mask 20. In the exemplary embodiment of FIG. 7B, part D may have a quadrangle shape and may be disposed on the mask 20 to form a matrix shape. Part D is surrounded by part C, and part B is dotted. In addition, the number of part B's forming the main wall 160*a* may vary, and may be similar to the number of part D's.

Figure 8:
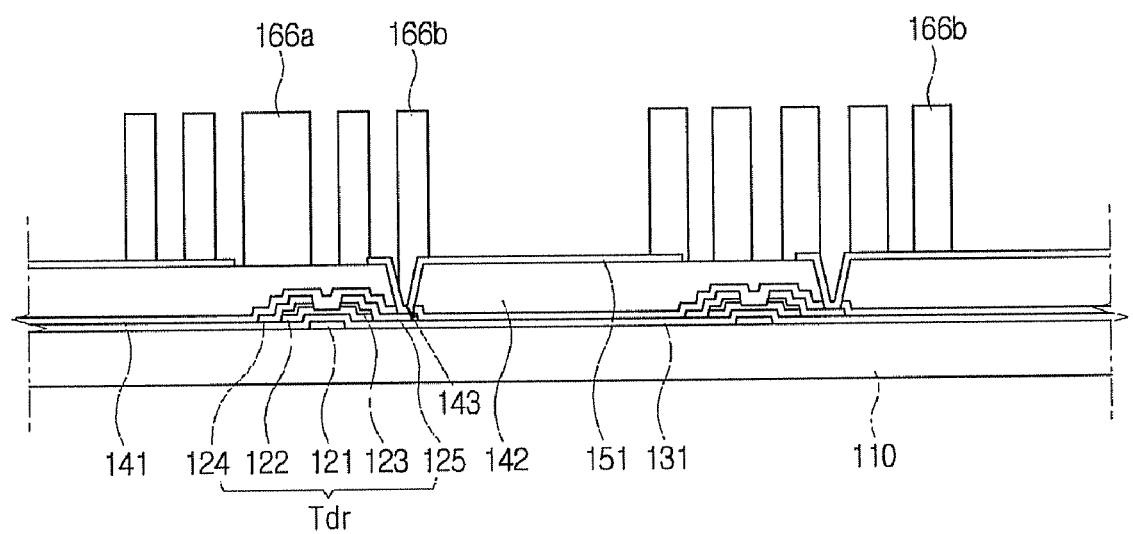
FIGS. 8 to 12 are schematic cross-sectional views illustrating an exemplary embodiment of a method of manufacturing the first exemplary embodiment of the display apparatus according to the present invention.

Referring to FIG. 8, photoresist patterns 166*a* and 166*b* are formed by developing the exposed photoresist layer 165. The photoresist pattern 166*a* corresponding to part B includes a relatively large width, and the photoresist pattern 166*b* corresponding to part C includes a relatively small width.

Figure 9:
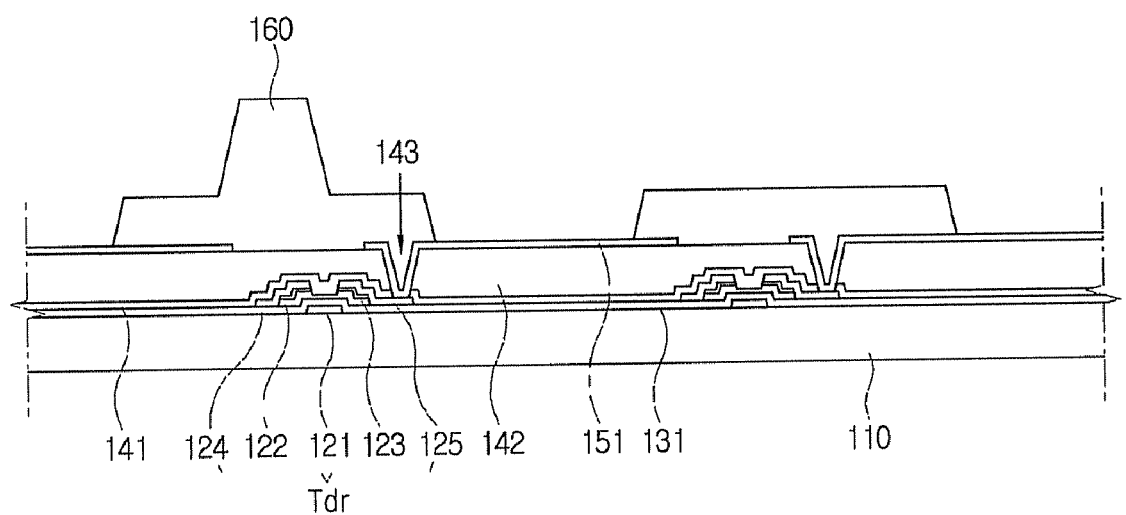

Referring to FIG. 9, the wall 160 is formed by heating the photoresist patterns 166*a* and 166*b* in a reflow process. The relatively wide photoresist pattern 166*a* maintains the height thereof to form the main wall 160*a*. The relatively narrower photoresist patterns 166*b* merges with one another, which decreases the height thereof, to thereby form the sub wall 160*c*.

Figure 10:
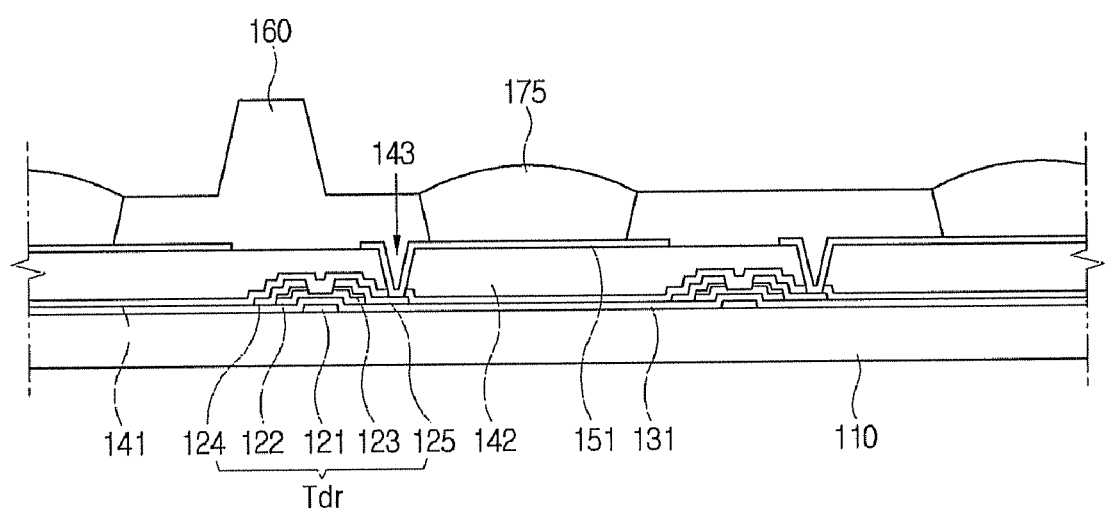

A hole injection ink 175 is then dropped onto the pixel electrode 151 by an ink jet method to form the hole injection layer 171, as illustrated in FIG. 10. An exemplary embodiment of the hole injection ink 175 includes a mixture of polythiophen derivatives such as poly (3,4-ethylenedioxythiophene) ("PEDOT"), or other similar substances and polystyrene sulphonate ("PSS"), or other similar substances, and a solvent dissolving the same.

The hole injection layer 171 is then formed by drying the hole injection ink 175. In an exemplary embodiment, the hole injection ink 175 may be dried in a nitrogen environment and at an atmospheric pressure of about 1 Torr. If the pressure is excessively low, the hole injection ink 175 may dangerously and abruptly boil. Also, if the temperature is higher than the standard temperature, the solvent rapidly evaporates, and accordingly, a hole injection layer 171 with a uniform thickness may be difficult to form.

A heat treatment may be performed at about 200 degrees Celsius for about 10 minutes under an environment supplied with nitrogen after the hole injection ink 175 is dried. The heat treatment may be performed in a vacuum environment so that a solvent and/or moisture are completely removed from the hole injection layer 171.

Figure 11:
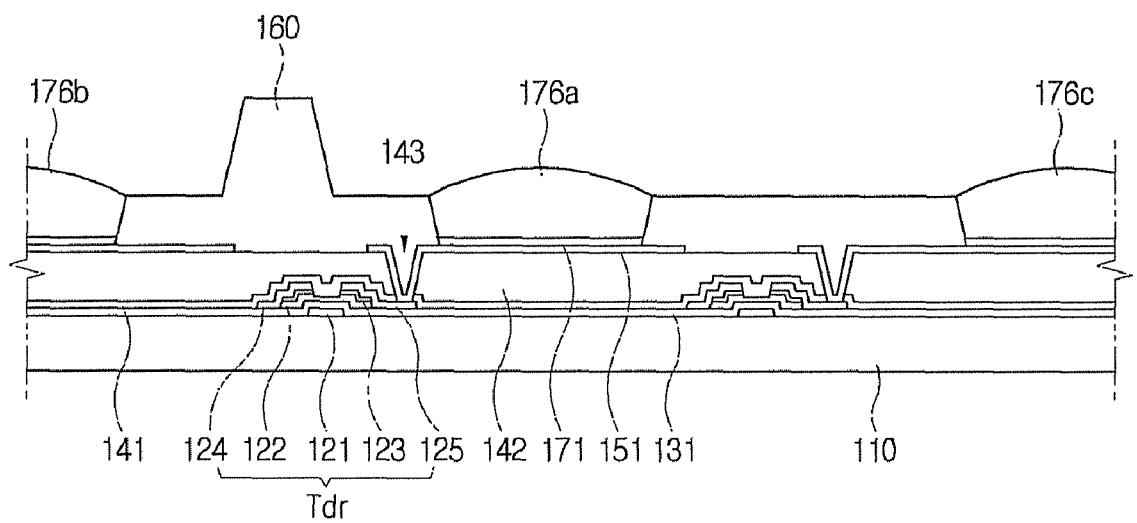
Figure 12:
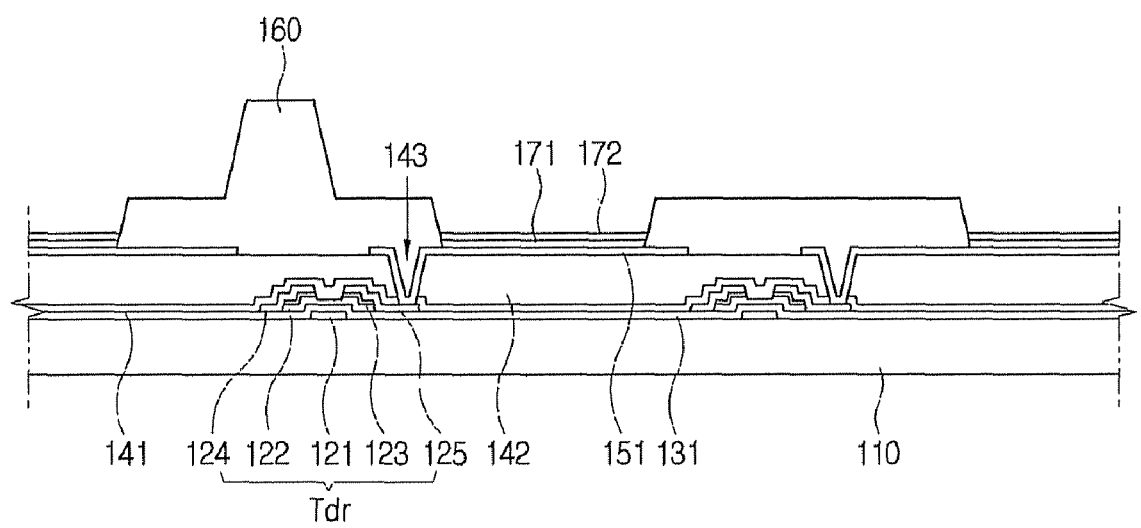

Then, referring to FIG. 11, light emitting inks 176a, 176b and 176c are dropped onto the hole injection layer 171 to form the light emitting layer 172. The light emitting inks 176a, 176b and 176c respectively include a red light emitting material, a green light emitting material and a blue light emitting material. The respective light emitting inks 176a, 176b and 176c may further include a solvent. The solvent is formed of a nonpolar solvent which is insoluble with respect to the hole injection layer 171, such as cyclohexylbenzene, dihydrobenzofuran, trimethylbenzene, tetramethylbenzene, or other similar substances to prevent the hole injection layer 171 from redissolving.

In an exemplary embodiment, the light emitting layer 172 is then formed by drying the light emitting inks 176a, 176b and 176c by a drying method similar to the drying of the hole injection ink 175.

The common electrode 180 is then formed over the wall 160 and the light emitting layer 172 to complete the display substrate 100, as shown in FIG. 3.

Figure 13:
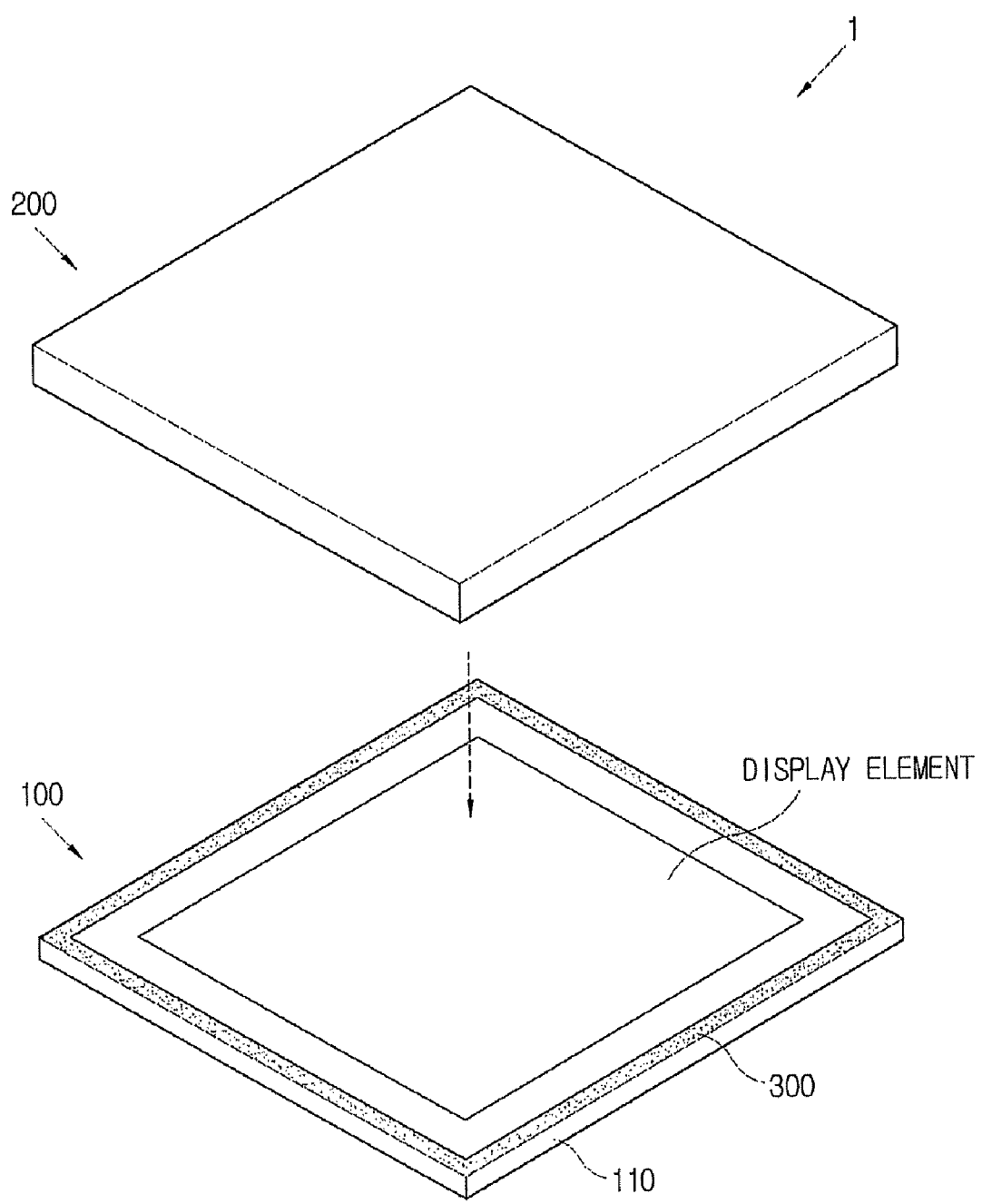
FIG. 13 is a schematic perspective view illustrating the exemplary embodiment of a method of manufacturing the first exemplary embodiment of the display apparatus according to the present invention.

Referring to FIG. 13, the sealant 300 is disposed to surround the display element, and the encapsulation substrate 210 is attached to the display substrate 100 to complete the display apparatus 1.

Hereinafter, other exemplary embodiments of a method of manufacturing the display apparatus according to the first embodiment of the present invention will be now described in more detail with reference to FIGS. 14 to 17.

Figure 14:
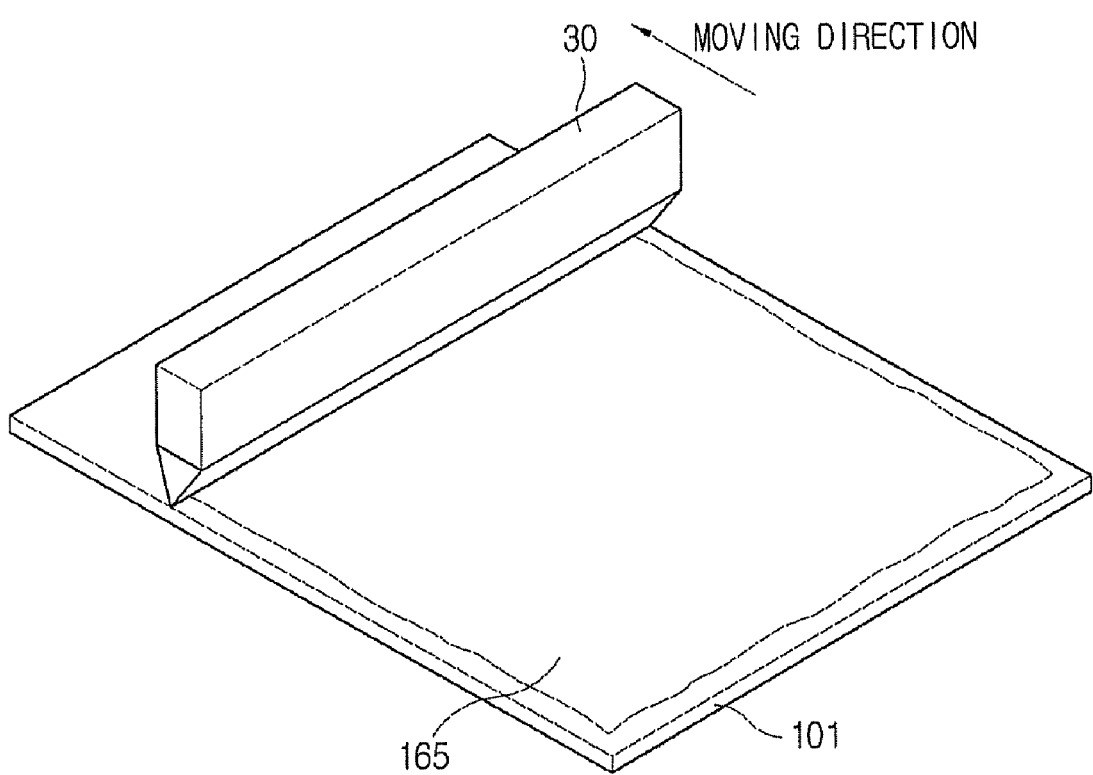
FIG. 14 is a schematic perspective view illustrating alternative exemplary embodiments of methods of manufacturing the first exemplary embodiment of the display apparatus according to the present invention.
Figure 15:
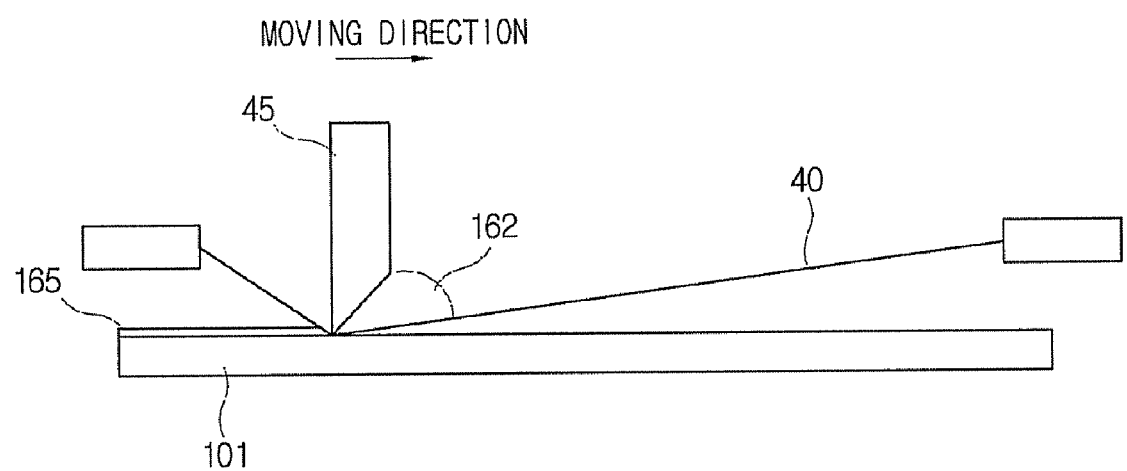
FIG. 15 is a schematic view and FIGS. 16 and to 17 are schematic cross-sectional views illustrating further alternative exemplary embodiments of methods of manufacturing the first exemplary embodiment of the display apparatus according to the present invention.
Figure 16:
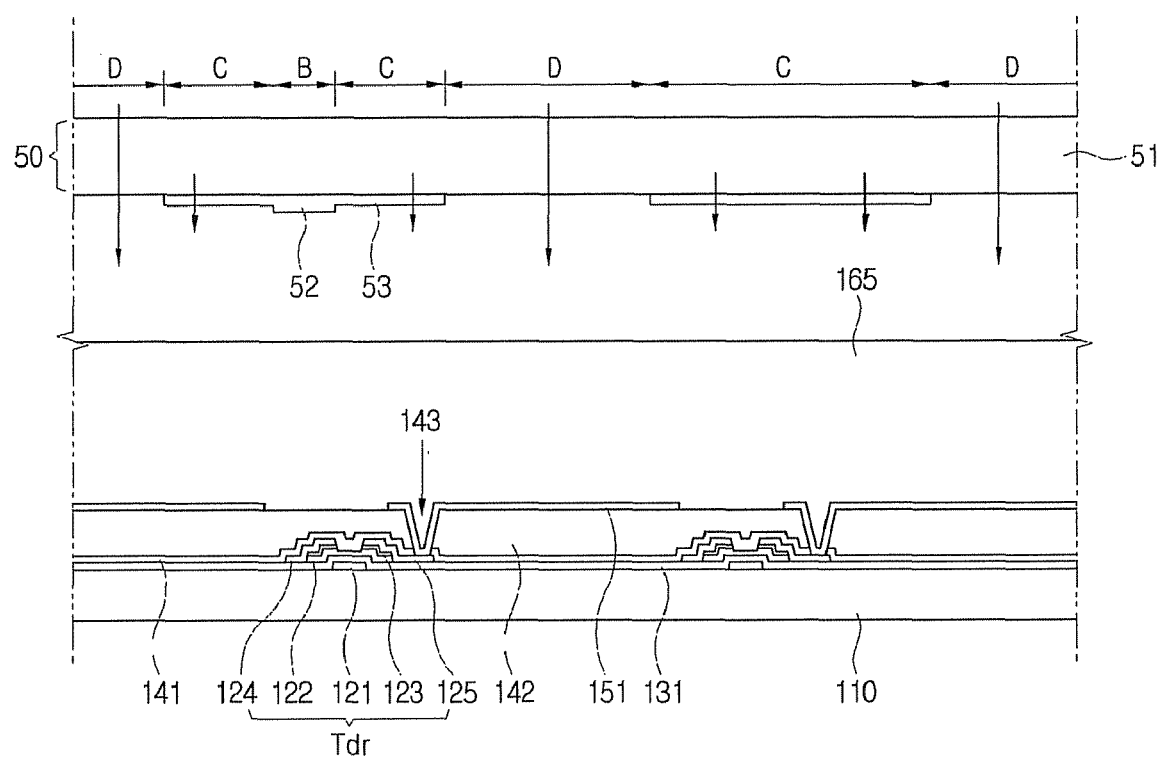
Figure 17:
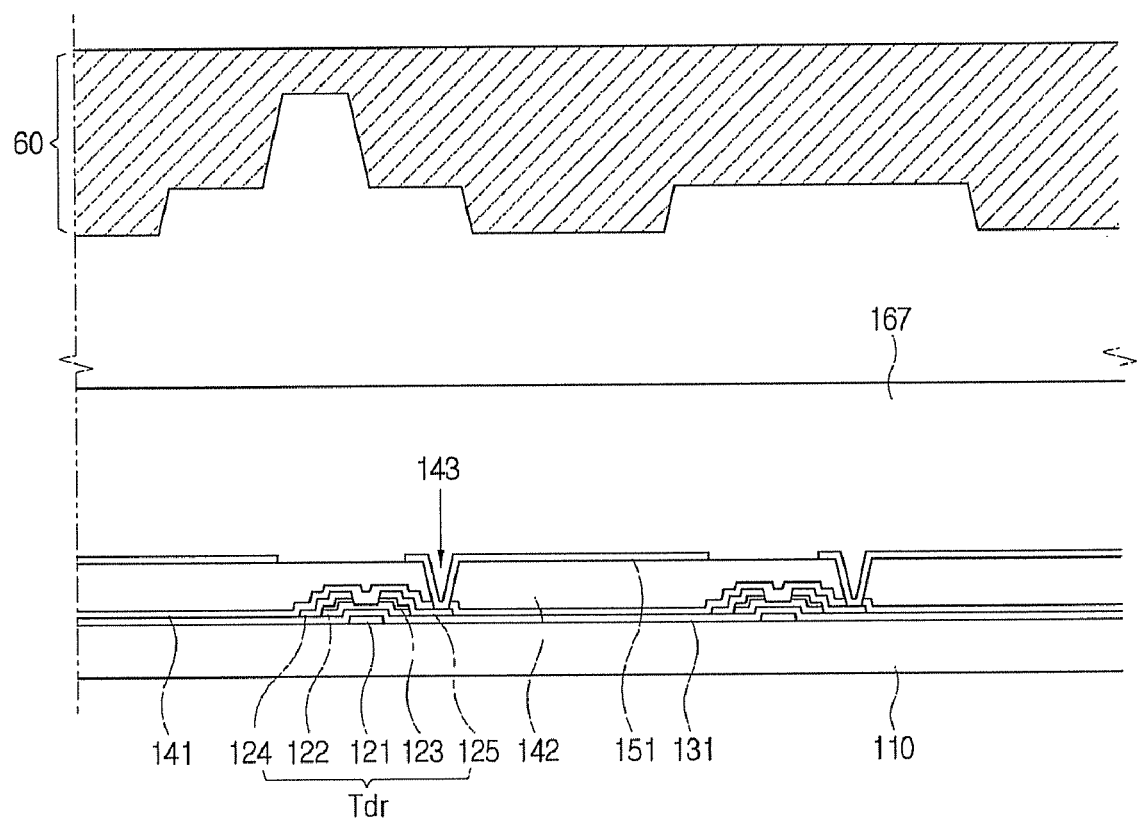

FIGS. 14 and 15 respectively illustrate alternative exemplary embodiments of methods for forming the photoresist layer 165, and FIGS. 16 and 17 respectively illustrate alternative exemplary embodiments of methods for forming the wall 160.

Referring to FIG. 14, the photoresist layer 165 is formed by a slit coating method. A slit coater 30 moves in a moving direction over the display substrate 101 to form the photoresist layer 165.

Referring to FIG. 15, the photoresist layer 165 is formed by a screen printing method, in another exemplary embodiment. A screen mask 40 is positioned above the display substrate 101, and a photoresist material 162 is positioned over the screen mask 40. A squeezer 45 then moves in a moving direction as illustrated in FIG. 15, and the screen mask 40 is deformed toward the display substrate 101, such that the photoresist material 162 passes through the screen mask 40 and the photoresist material 162 is jetted onto the display substrate 101.

Referring now to FIG. 16, the photoresist layer 165 is exposed by using a semitransmissive mask 50 in an exemplary embodiment. The semitransmissive mask 50 includes a light transmissive mask substrate 51, a blocking pattern 52 formed to a part B, and a semitransmissive pattern 53 formed to a part C. The blocking pattern 52 and the semitransparent pattern 53 may be formed of molybdenum silicide ("MoSi") or chromium nitride ("CrN"), and may have a different transmissivities according to the thickness thereof.

Referring to FIG. 17, the wall 160 is formed by an imprint method, in an exemplary embodiment. A wall material layer 167 is formed on the pixel electrode 151. In an exemplary embodiment, the wall material layer 167 may be formed of material other than a photoresist material.

A mold 60 is provided above the wall material layer 167 to have intaglio with respect to the wall 160. If the wall material layer 167 is imprinted with the mold 60, the intaglio of the mold 60 is filled with some wall material layer 167, and the remaining wall material layer 167 is removed. In an exemplary embodiment, the mold 60 may include a throughhole (not shown) through which the remaining wall material layer 167 is discharged. The mold 60 is then removed, and the wall 160 is thereby completed.

Hereinafter, a second exemplary embodiment of a display apparatus according to the present invention will now be described in more detail with reference to FIG. 18.

Figure 18:
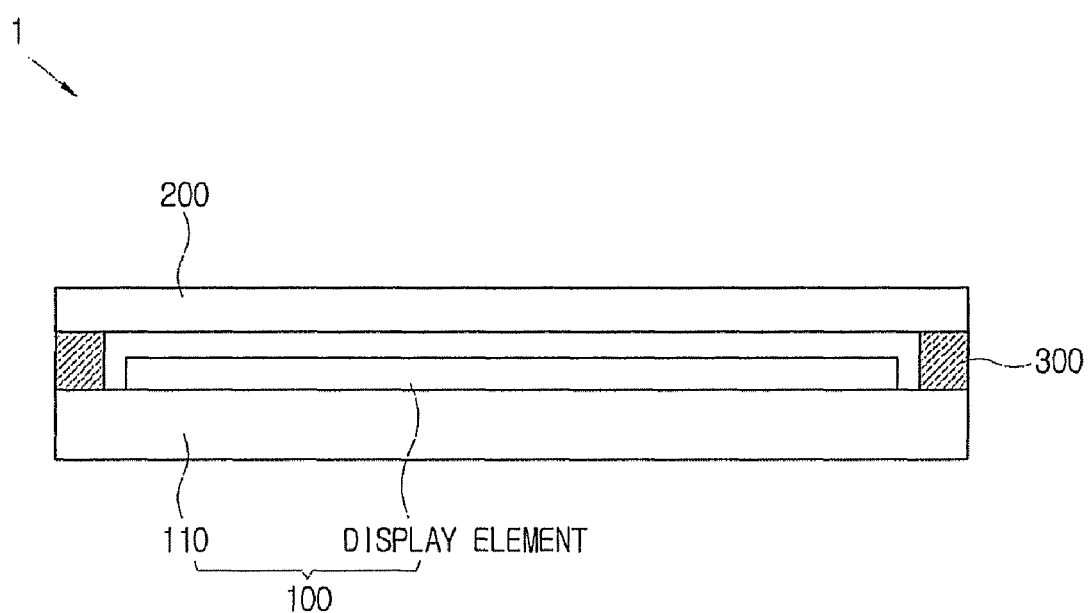
FIGS. 18 to 20 are schematic cross-sectional views illustrating alternative exemplary embodiments of a display apparatus according to the present invention.

FIG. 18 illustrates an alternative exemplary embodiment of a display apparatus 1 according to the present invention. The display apparatus 1 includes an encapsulation part 210 as well as an insulation substrate 110, each having a planar shape. The interval between the insulation substrate 110 and the encapsulation part 210 is maintained constant by a sealant 300. The sealant 300 may include a spacer (not shown).

Hereinafter, another alternative exemplary embodiment of a display apparatus according to the present invention will now be described in more detail with reference to FIG. 19.

Figure 19:
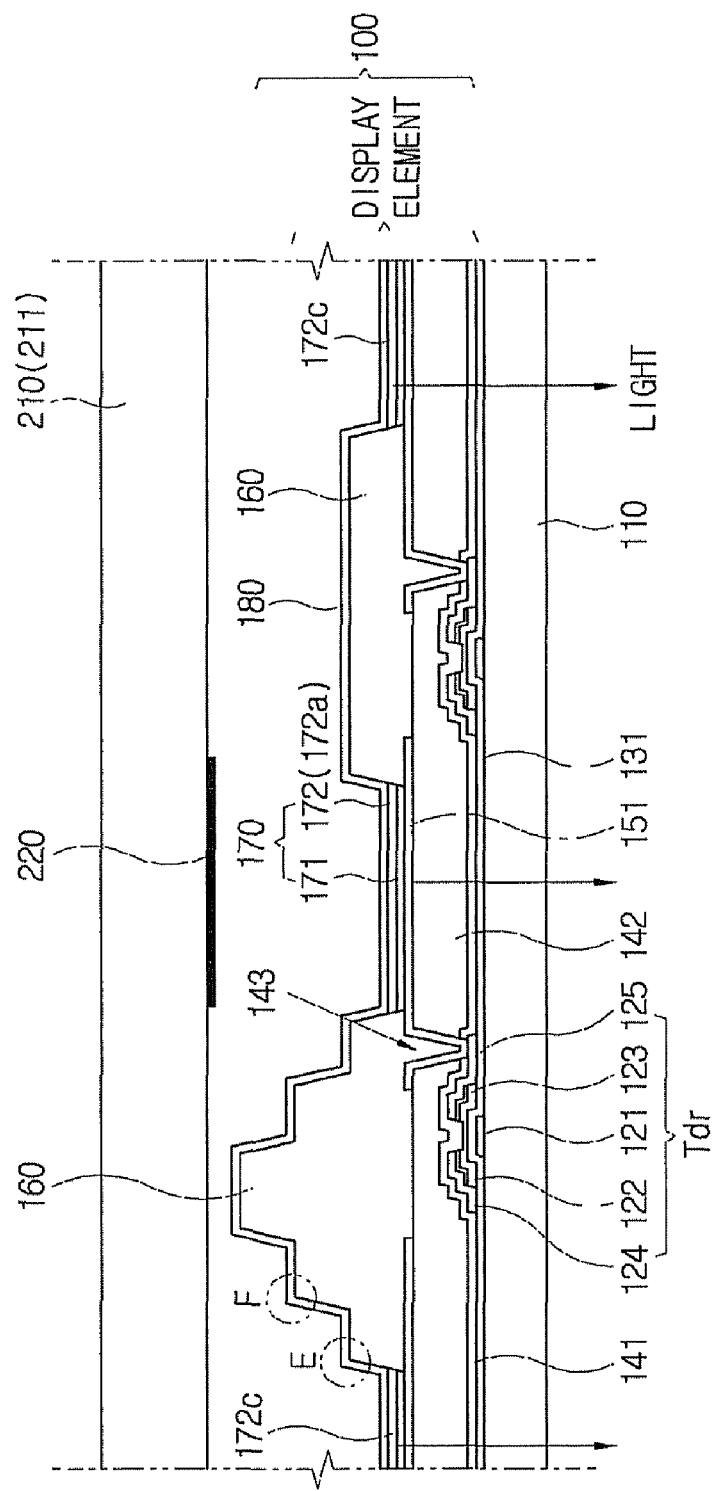

As shown in FIG. 19, an exemplary embodiment of a wall 160 of this alternative exemplary embodiment of a display apparatus according to the present invention includes two stairs E and F.

Hereinafter, yet another alternative exemplary embodiment of a display apparatus according to the present invention will now be described in more detail with reference to FIG. 20.

Figure 20:
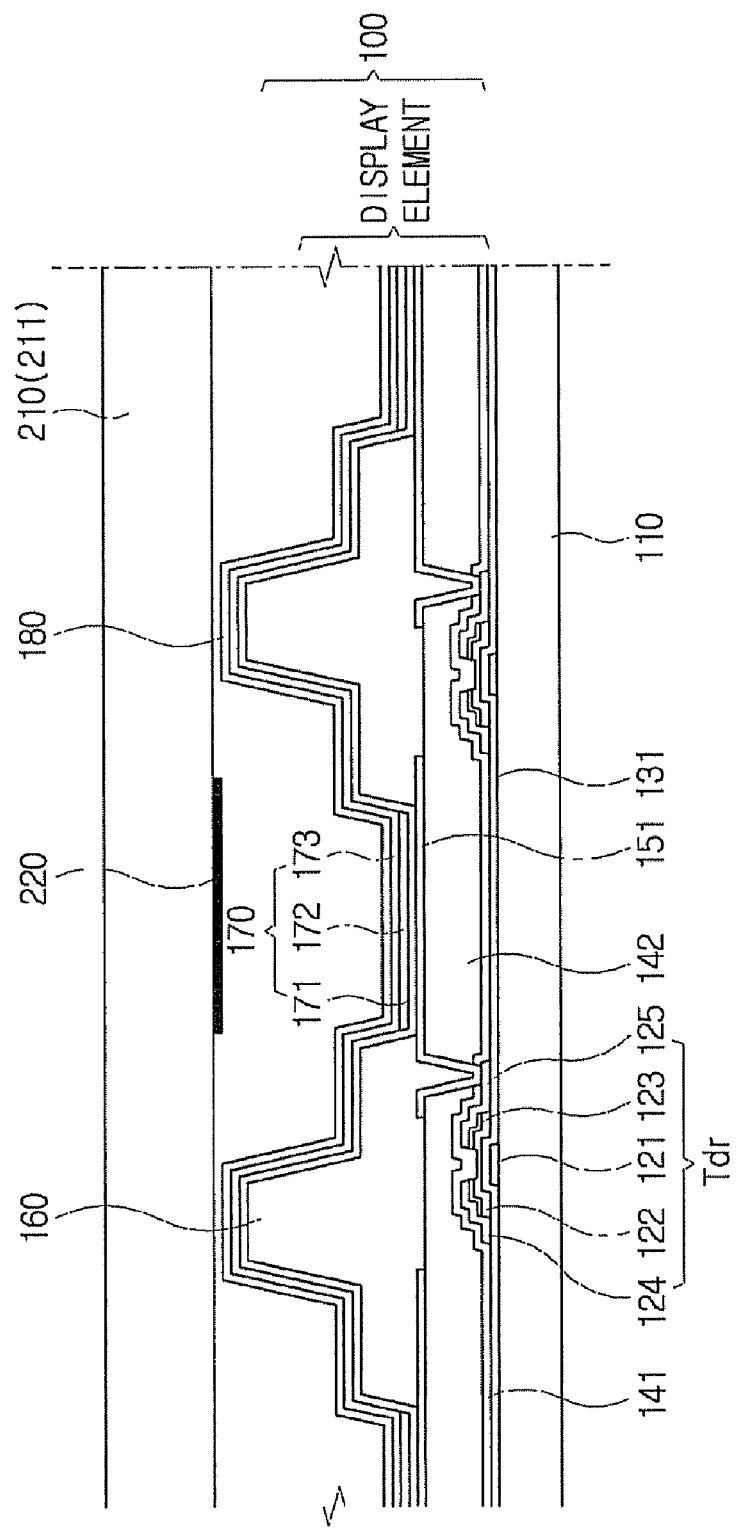

As shown in FIG. 20, an exemplary embodiment of an organic layer 170 of the present alternative exemplary embodiment of a display apparatus according to the present invention includes a lower organic layer 171, a light emitting layer 172 and an upper organic layer 173. The lower organic layer 171 and the upper organic layer 173 are formed all over the wall 160, as illustrated in FIG. 20. An exemplary embodiment of the organic layer 170 is formed of a low molecular substance by a vaporization method. The light emitting layer 172 may be formed all over the wall 160, and a color filter may be formed between an insulation substrate 110 and a pixel electrode 151, wherein the light emitting layer 172 emits a white light.

The lower organic layer 171 includes a hole injection layer and a hole transporting layer, and is formed of an intensively fluorescent amine derivatives such as triphenyldiamine derivatives, styrylamine derivatives, amine derivatives having aromatic condensation ring, or other similar substances.

The upper organic layer 173 includes an electron transporting layer, and is formed of quinoline derivatives, especially tris (8-hydroxyquinoline) aluminum ("Alq3").

As described above, exemplary embodiments of a display apparatus and exemplary embodiments of a manufacturing method thereof according to the present invention can prevent deformation of an encapsulation substrate and deterioration of the display apparatus due to the deformation of the encapsulation substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A display apparatus comprising:
   a substrate;
   a transistor on the substrate;
   a pixel electrode connected to the transistor;
   a wall on the transistor and having an opening exposing the pixel electrode, the wall including a main wall and a sub wall, the main wall having a first height and the sub wall having a second height less than the first height of the main wall;
an organic layer on the pixel electrode;
a common electrode on the organic layer; and
an encapsulation substrate coupled to the substrate,
wherein a portion of the common electrode between the encapsulation substrate and the main wall is spaced from the encapsulation substrate.

2. The display apparatus according to claim 1, wherein the first height is about 50 micrometers (μm) to about 1000 micrometers (μm).

3. The display apparatus according to claim 1, wherein the second height is about 10 percent to 50 percent of the first height.

4. The display apparatus according to claim 1, wherein the wall is formed of a photoresist material.

5. The display apparatus according to claim 1, wherein the common electrode is disposed directly on the sub wall.

6. The display apparatus according to claim 1, wherein at least one of the first height and the second height is greater than a height of the pixel electrode.

7. The display apparatus according to claim 2, wherein the second height is about 0.5 micrometers (μm) to about 30 micrometers (μm).

8. The display apparatus according to claim 1, wherein a surface of the substrate is encapsulated when the encapsulation substrate is coupled to the substrate.

9. The display apparatus according to claim 8, wherein the pixel electrode is formed at the encapsulated surface of the substrate.

10. The display apparatus according to claim 1, wherein the encapsulation substrate comprises a first part and a second part, wherein the first part is substantially parallel to the substrate, and the second part extends from the first part toward the substrate.

11. The display apparatus according to claim 10, further comprising a sealant interposed between the substrate and the second part, and which attaches the substrate to the encapsulation substrate.

12. The display apparatus according to claim 10, wherein the encapsulation substrate is formed by etching a glass plate.

* * * * *